United States Patent
Barth

(10) Patent No.: US 7,443,739 B2
(45) Date of Patent: Oct. 28, 2008

(54) INTEGRATED SEMICONDUCTOR MEMORY DEVICES WITH GENERATION OF VOLTAGES

(75) Inventor: Roland Barth, München (DE)

(73) Assignee: Qimonda AG, Munich (DE)

( * ) Notice: Subject to any disclaimer, the term of this patent is extended or adjusted under 35 U.S.C. 154(b) by 91 days.

(21) Appl. No.: 11/669,959

(22) Filed: Feb. 1, 2007

(65) Prior Publication Data
US 2007/0183225 A1 Aug. 9, 2007

(30) Foreign Application Priority Data
Feb. 2, 2006 (DE) .................. 10 2006 004 851

(51) Int. Cl.
*G11C 5/14* (2006.01)
(52) U.S. Cl. ................ 365/189.09; 365/189.08; 365/233.11; 365/233.12
(58) Field of Classification Search ............ 365/189.09, 365/189.08, 233.11, 233.1, 233.12
See application file for complete search history.

(56) References Cited

U.S. PATENT DOCUMENTS

| 6,055,210 A * | 4/2000 | Setogawa | 365/233.12 |
|---|---|---|---|
| 6,094,395 A | 7/2000 | Weinfurtner | |
| 6,661,728 B2 | 12/2003 | Tomita et al. | |
| 2005/0270890 A1* | 12/2005 | Kim | 365/233 |
| 2006/0238216 A1* | 10/2006 | Yada et al. | 326/3 |
| 2007/0253125 A1* | 11/2007 | Kuroda | 361/18 |
| 2007/0268777 A1* | 11/2007 | Brox | 365/233 |
| 2008/0116950 A1* | 5/2008 | Baek et al. | 327/158 |

* cited by examiner

*Primary Examiner*—Richard Elms
*Assistant Examiner*—Hien N Nguyen
(74) *Attorney, Agent, or Firm*—Edell, Shapiro & Finnan, LLC

(57) ABSTRACT

An integrated semiconductor memory device includes a clock terminal that applies an external clock signal. Read and write accesses are controlled synchronously with the external clock signal. A frequency detector is connected to the clock terminal to detect the frequency of the external clock signal. The frequency detector circuit generates a control signal in a manner dependent on the frequency of the external clock signal, the control signal being used to drive a controllable voltage generator, which generates a level of an internal supply voltage in a manner dependent on the control signal, from which supply voltage further control and supply voltages are derived. The integrated semiconductor memory device makes it possible to adapt the level of internally generated voltages of the integrated semiconductor memory device to the frequency of the external clock signal.

16 Claims, 4 Drawing Sheets

INTEGRATED SEMICONDUCTOR MEMORY DEVICES WITH GENERATION OF VOLTAGES

CROSS REFERENCE TO RELATED APPLICATIONS

This application claims priority under 35 U.S.C. §119 to Application No. DE 102006004851.2 filed on Feb. 2, 2006, entitled "Integrated semiconductor memory device with Generation of Voltages," the entire contents of which are hereby incorporated by reference.

FIELD

Integrated semiconductor memory devices are described herein in which internal operating voltages are generated by voltage generators on a memory chip of the integrated semiconductor memory devices. Methods are further described herein for operating integrated semiconductor memory devices in which internal voltages are generated by voltage generators that are arranged on a memory chip of the integrated semiconductor memory devices.

BACKGROUND

Integrated semiconductor memory devices, for example DRAM (Dynamic Random Access Memory) semiconductor memory devices, include a multiplicity of circuit components on a memory chip. FIG. 1 shows an integrated semiconductor memory device 200 comprising a memory cell array 210 comprising memory cells SZ. In the case of DRAM memory cells, a memory cell includes a storage capacitor SC and a selection transistor AT. The memory cells are in each case arranged at a crossover point between a word line WL and a bit line BL.

In order to carry out a read access, a read command LK is applied to a control terminal S220 of a control circuit 220. An address is applied to an address terminal A200, and is buffer-stored in an address register 230. After the control circuit 220 has detected the read command LK at its control terminal S220, a memory cell selected by the address buffer-stored in the address register 230 is activated for the read access. For selection of the memory cell defined by the address, a row decoder 250 selects a row line (word line) within the memory cell array 210. For this purpose, a high level of a word line control voltage VPP is fed in onto the selected word line.

The selection transistor AT, which is embodied as an n-channel field-effect transistor in FIG. 1, is controlled into the on state by the high level of the word line control voltage VPP, with the result that the storage capacitor SC of the memory cell SZ is conductively connected to the connected bit line BL.

A column decoder 240 is provided for selection of the bit line BL connected to the activated memory cell SZ. The bit line selected by the column decoder 240 is subsequently connected to a sense amplifier (not illustrated in FIG. 1). The sense amplifier amplifies the potential on the bit line which has formed on the bit line after the connection of the storage capacitor SC due to the activated selection transistor AT to a low voltage level VBL or a high voltage level VBH. Consequently, a datum DQ having a high potential level or a datum DQ having a low potential level is generated at the data terminal D200.

In order to carry out a write access to the memory cell SZ, the write command SK is applied to the control terminal S220 of the control circuit 220. By virtue of the address applied to the address terminal A200, the row decoder 250 selects the word line connected to the memory cell to be read and the column decoder 240 selects the bit line connected to the memory cell to be read. As a result of the driving of the selected word line with the high potential of the word line control voltage VPP, the selection transistor AT of the selected memory cell is controlled into the on state. As a result of the driving of the bit line BL with a high potential level of the bit line voltage VBH, a one level can be stored in the memory cell. As a result of the driving of the bit line BL with the low potential of the bit line voltage VBL, by contrast, a datum having a zero level can be stored in the memory cell SZ. In this case, the potential states VBH and VBL respectively, are generated by the sense amplifier on the bit line BL in a manner dependent on the data DQ present at the data terminal D200.

The control circuit 220 has a supply voltage terminal V220 for application of a supply voltage VB. Likewise, the column decoder 240 has a supply voltage terminal V240 and the row decoder 250 has a supply voltage terminal V250 for application of the supply voltage VB. The supply voltage VB is provided by a controllable voltage generator 284 at an output terminal A284.

The integrated semiconductor memory device furthermore has controllable voltage generators 281, 282 and 283. The controllable voltage generator 281 generates at an output terminal A281 the high potential of the word line control voltage VPP for controlling the selection transistor AT into the on state. The controllable voltage generator 282 generates at an output terminal A282 the low potential of the bit line voltage VBL, which is fed in for the purpose of storing the zero level into the memory cell SZ onto the bit line BL. The controllable voltage generator 283 generates at an output terminal A283 the high potential of the bit line voltage VBH, which is fed in for the purpose of storing a one level into the memory cell SZ onto the bit line BL.

The voltage generators 281, 282, 283 and 284 generate the voltages VPP, VBL, VBH and VB from an internal supply voltage Vint fed to them by a further controllable voltage generator 270. The controllable voltage generator 270 is connected to a supply voltage terminal V200 for application of an external supply voltage Vext. It generates the stabilized internal supply voltage Vint from the external supply voltage Vext.

In order to be able to compensate for manufacturing tolerances, the controllable voltage generator 270 is embodied in trimmable fashion. Using a control signal AWS fed to it at a control terminal S270, the level of the internal supply voltage can thus be varied. However, the level of the internal supply voltage Vint cannot be increased arbitrarily. An excessively high voltage would lead, for example, in the case of circuit components on the memory chip of the integrated semiconductor memory device, to degradation effects such as hot carrier effects, for example, with the result that the service life of transistors of the integrated semiconductor memory device, for example, would be reduced.

For specific types of integrated semiconductor memories, for example semiconductor memories which are used for graphics applications, a long lifetime of circuit components on the memory chip is dispensed with since developments advance very rapidly in this field, so that the products in this segment are also already obsolete very rapidly and are replaced by newer memories. Thus, at the present time the use of semiconductor memories for graphics applications is in the region of approximately 5 years. The speed and performance of integrated semiconductor memories provided for graphics applications are increased in a targeted manner by trimming up the internal supply voltage Vint. The internal supply voltage is trimmed up usually by activation of so-called trimming options within an on-chip voltage generator system of the integrated semiconductor memory device.

In FIG. 1, by way of example, a memory circuit 260 comprising memory elements, for example fuse elements 261, is provided for setting the trimming options. In integrated semiconductor memories provided for graphics applications, for example, specific fuse elements of the memory circuit 260 are activated during the manufacturing process. The state of the fuse elements of the memory circuit 260 is evaluated by an evaluation circuit 290. In a manner dependent on the activated fuse elements, the evaluation circuit 290 generates a control signal AWS, which is fed to the control terminal S270 of the controllable voltage generator 270. Consequently, it is possible to generate an internal supply voltage Vint lying above the internal supply voltage usually used for driving the controllable voltage generators 281, 282, 283 and 284. As a result the voltage generators also generate greater output voltages VPP, VBL, VBH and VB derived from the increased internal supply voltage.

One disadvantage in the case of this method, however, is that, as early as during the manufacturing of the integrated semiconductor memories, it is necessary to define whether the voltage generators 270, 281, 282, 283 and 284 present on the memory chip generate increased voltages. This early dedication is already effected in the context of the wafer test, in which usually by activation of laser fuses, the on-chip voltages are trimmed to the values determined for the respective target application. However, this necessitates high logistical outlay in the area of product planning.

Since the state of the laser fuses is only one-time programmable, such integrated semiconductor memories furthermore have a lack of flexibility. Thus, dynamic voltage regulation of the on-chip voltages cannot be achieved. It is desirable, however, to reduce the level of the internal supply voltage in the case of low capacity utilization of the semiconductor memory, in the case of few memory accesses per unit time. Consequently, in the case of present-day integrated semiconductor memories, a high electrical power loss occurs as a result of a lack of flexibility in the setting of the internal voltages or as a result of the static predefinition of the internal voltages.

SUMMARY

Integrated semiconductor memory devices are described herein in which the generation of internal voltage levels is adapted to the number of memory accesses. Methods are also described herein for operating integrated semiconductor memory devices in which the generation of internal voltage levels is adapted to the number of memory accesses.

An integrated semiconductor memory device described herein comprises a clock terminal to apply a clock signal, a first controllable voltage generator to generate an internal operating voltage that can be fed as supply or control voltage to a circuit component of the integrated semiconductor memory device for carrying out read and write accesses. The integrated semiconductor memory device furthermore comprises a frequency detector to detect a frequency of the clock signal, the frequency detector being connected to the clock terminal. The first controllable voltage generator is embodied in such a way that it generates a level of the internal operating voltage in a manner dependent on the frequency of the clock signal detected by the frequency detector.

In one embodiment, the frequency detector is embodied in such a way that it generates a first control signal in a manner dependent on the frequency of the clock signal. The first controllable voltage generator is embodied in such a way that it generates the level of the internal operating voltage in a manner dependent on the first control signal.

In accordance with a further embodiment, the first controllable voltage generator is embodied in such a way that it generates a first level of the internal operating voltage if the frequency detector circuit detects a first frequency of the clock signal, and generates a second level of the internal operating voltage if the frequency detector circuit detects a second frequency of the clock signal, the second frequency of the clock signal being greater than the first frequency of the clock signal and the second level of the internal operating voltage being greater than the first level of the internal operating voltage.

The integrated semiconductor memory device further comprises a supply voltage terminal to apply an external supply voltage. The integrated semiconductor memory device furthermore comprises a second controllable voltage generator to generate an internal supply voltage comprising a control terminal for driving with a control signal, the second controllable voltage generator being connected to the supply voltage terminal. The control terminal of the second controllable voltage generator is connected to the frequency detector for the purpose of driving with the first control signal. The second controllable voltage generator is embodied in such a way that it generates from the external supply voltage a level of the internal supply voltage in a manner dependent on the first control signal. The second controllable voltage generator is connected to the first controllable voltage generator for the purpose of driving the first controllable voltage generator with the internal supply voltage. In this embodiment, the first controllable voltage generator is embodied in such a way that it generates the level of the internal operating voltage in a manner dependent on the level of the internal supply voltage.

Furthermore, the integrated semiconductor memory device comprises a voltage detector to detect a level of the external supply voltage, which is connected to the supply voltage terminal. The first controllable voltage generator is embodied in such a way that it generates a level of the internal operating voltage in a manner dependent on the level of the external supply voltage detected by the voltage detector.

In another embodiment of the integrated semiconductor memory device, the voltage detector is embodied in such a way that it generates a second control signal in a manner dependent on the level of the external supply voltage. In this embodiment, the first controllable voltage generator is embodied in such a way that it generates the level of the internal operating voltage in a manner dependent on the second control signal.

In another embodiment of the integrated semiconductor memory device, the first controllable voltage generator is embodied in such a way that it generates a first level of the internal operating voltage when the voltage detector circuit detects a first level of the external supply voltage, and generates a second level of the internal operating voltage when the voltage detector circuit detects a second level of the external supply voltage, the second level of the external supply voltage being greater than the first level of the external supply voltage and the second level of the internal operating voltage being greater than the first level of the internal operating voltage.

In a further embodiment, the integrated semiconductor memory device comprises an evaluation circuit to evaluate the first control signal and the second control signal and to generate a third control signal. The evaluation circuit is embodied in such a way that it generates a state of the third control signal in a manner dependent on respective states of the first and second control signals. The control terminal of the second controllable voltage generator is connected to the evaluation circuit for the purpose of driving with the third control signal. The second controllable voltage generator is embodied in such a way that it generates the level of the internal supply voltage in a manner dependent on the third control signal.

In another embodiment of the integrated semiconductor memory device, the second controllable voltage generator contains a first voltage generator circuit to generate a first internal supply voltage. The first voltage generator circuit is embodied in such a way that it generates the first internal supply voltage with a level that is less than the level of the external supply voltage.

In another embodiment of the integrated semiconductor memory device, the second controllable voltage generator contains a second voltage generator circuit to generate a second internal supply voltage. The second voltage generator circuit is embodied in such a way that it generates the second internal supply voltage with a level that is greater than the level of the external supply voltage.

The second voltage generator circuit may be embodied as a charge pump.

In one preferred embodiment, the integrated semiconductor memory device includes a memory cell array comprising memory cells that are in each case arranged at a crossover point of a row line and a column line. The integrated semiconductor memory device furthermore includes a column decoder to select one of the column lines and a row decoder to select one of the row lines. The column and row decoders can in each case be fed the internal operating voltage as supply voltage to select a column and row line to carry out the read and write accesses.

In a further embodiment of the integrated semiconductor memory device, the memory cell comprises a selection transistor to select the memory cell for the read and write access. The internal operating voltage can be fed to the selection transistor as control voltage to select the memory cell for the read and write access.

A method for operating an integrated semiconductor memory device includes providing an integrated semiconductor memory device comprising a frequency detector to detect a frequency of a clock signal that can be applied to a clock terminal of the integrated semiconductor memory device, and comprising a controllable voltage generator to generate an internal operating voltage that can be fed as supply or control voltage to a circuit component of the integrated semiconductor memory device for carrying out read and write accesses. The clock signal is applied to the clock terminal of the integrated semiconductor memory device. The frequency of a clock signal is detected with the frequency detector. A level of the internal operating voltage is generated in a manner dependent on the frequency of the clock signal detected by the frequency detector. The circuit component of the integrated semiconductor memory device is driven with the internal operating voltage for carrying out the read and write accesses.

In accordance with one embodiment of the method, the controllable voltage generator generates a first level of the internal operating voltage when the frequency detector circuit detects a first frequency of the clock signal, and generates a second level of the internal operating voltage when the frequency detector circuit detects a second frequency of the clock signal, the second frequency of the clock signal being greater than the first frequency of the clock signal and the second level of the internal operating voltage being greater than the first level of the internal operating voltage.

In another embodiment of the method, the integrated semiconductor memory device comprises a voltage detector to detect a level of an external supply voltage that can be fed to a supply voltage terminal of the integrated semiconductor memory device. In the step of generation of the level of the internal operating voltage, the level of the internal operating voltage is generated in a manner dependent on the frequency of the clock signal detected by the frequency detector and in a manner dependent on the level of the external supply voltage detected by the voltage detector.

The above and still further features and advantages of the methods and devices described herein will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
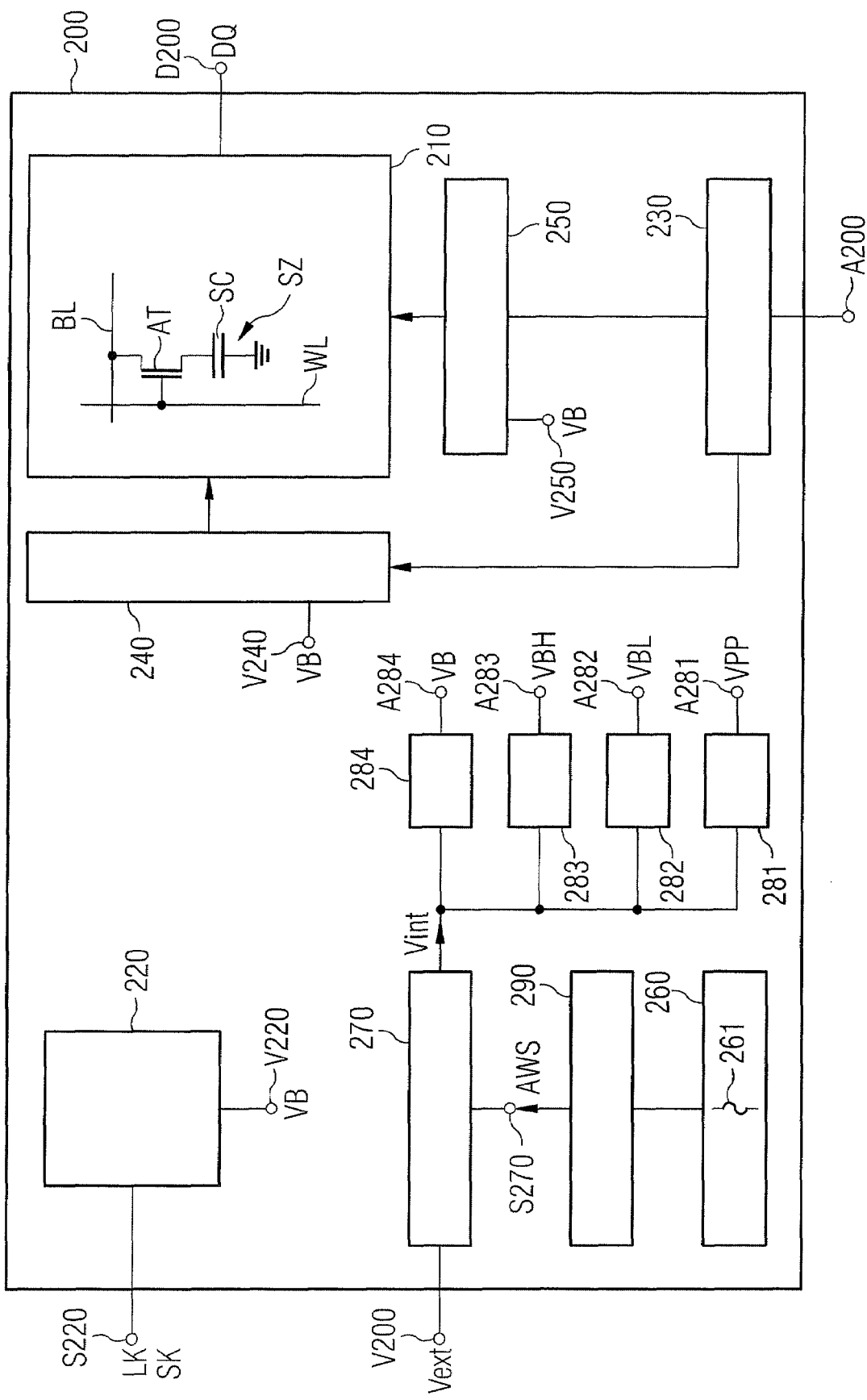
FIG. 1 shows a first embodiment of an integrated semiconductor memory device with generation of internal voltages.
Figure 2:
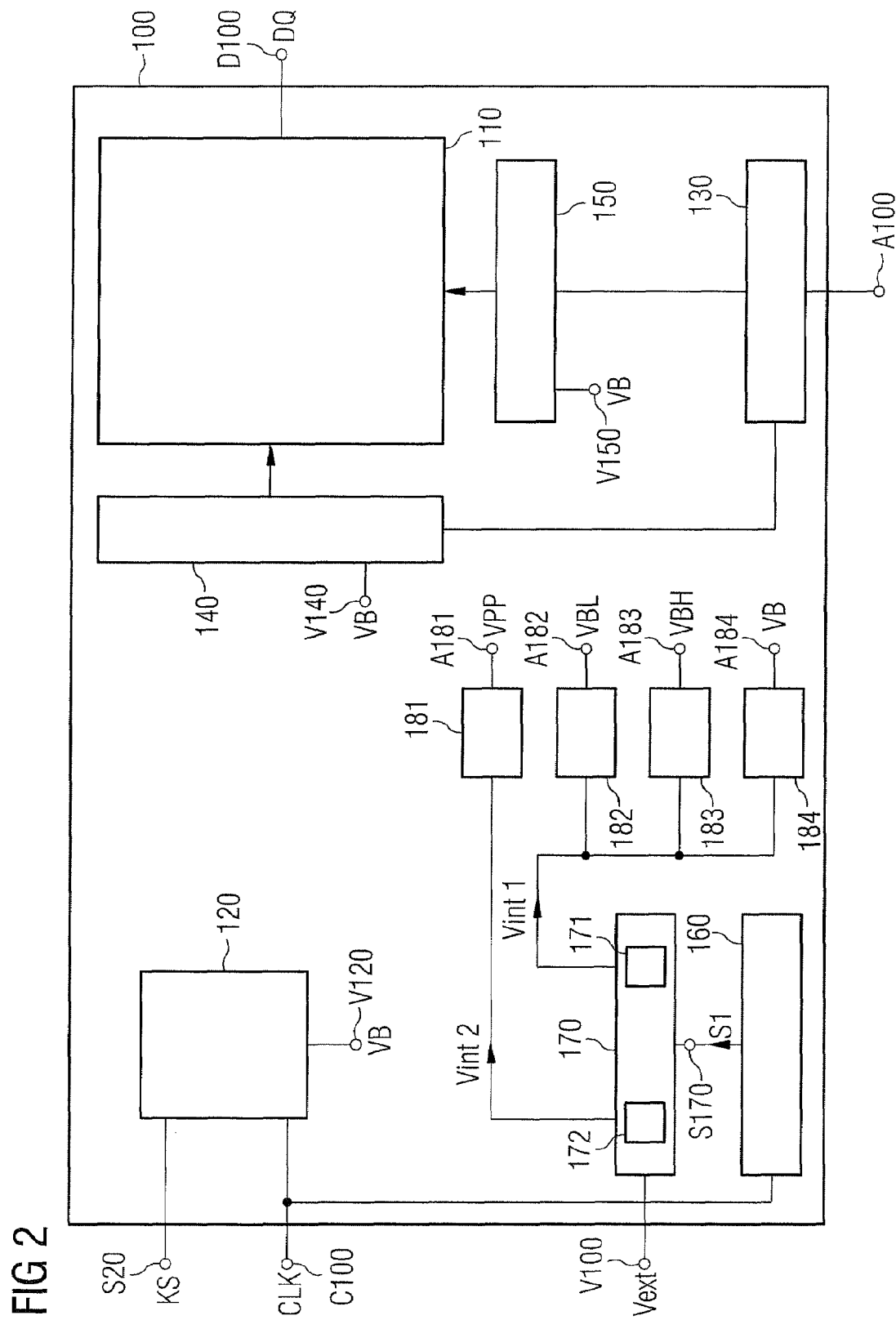
FIG. 2 shows a second embodiment of an integrated semiconductor memory device with generation of internal voltages.

FIG. 2 shows an integrated semiconductor memory device 100 containing, in a manner similar to the integrated semiconductor memory device 200 shown in FIG. 1, a memory cell array 110, in which memory cells, for example DRAM memory cells, are arranged along word lines and bit lines. In order to activate a memory cell for a read or write access, a control circuit 120 is driven by a command signal KS at a control terminal S20. A memory cell within the memory cell array 110 can be selected by application of an address to an address terminal A100 of an address register 130. In a manner dependent on an applied column address, a column decoder 140 selects a bit line within the memory cell array 110 for the memory access. In a manner dependent on an applied row address, a row decoder 150 selects a word line within the memory cell array 110.

The integrated semiconductor memory device 100 of FIG. 2 is operated synchronously with a clock signal CLK, which is fed to the control circuit 120 at a clock terminal C100. According to the invention, the clock signal CLK is fed to a frequency detector 160. The latter evaluates the frequency of the clock signal CLK and generates on the output side a control signal S1, which is fed to a control terminal S170 of a controllable voltage generator 170.

The controllable voltage generator 170 is connected to a supply voltage terminal V100 for application of an external supply voltage Vext and has a voltage generator circuit 171 serving for generating an internal supply voltage Vint1. The voltage generator circuit 171 is embodied in such a way or configured or adapted such that it generates the internal supply voltage Vint1 with a level that is lower than a level of the external supply voltage Vext. The voltage generator circuit 171 is embodied as a voltage divider circuit, by way of example.

The level of the internal supply voltage Vint1 is fed to controllable voltage generators 182, 183 and 184. The controllable voltage generator 182 generates at an output terminal A182 the low level of the bit line voltage VBL, which is used for storing the zero level in a memory cell of the memory cell array 110. The controllable voltage generator 183 generates at an output terminal A183 the high level of the bit line voltage VBH, which is fed in onto a bit line of the memory cell array 110 for the purpose of storing the one level in a memory cell. The controllable voltage generator 184 generates at an output terminal A184 the supply voltage VB, which is fed as supply voltage to circuit components of the integrated semiconductor memory device, such as, for example, the control circuit 120, the column decoder 140 or the row decoder 150, at a supply voltage terminal V120, V140 and V150, respectively.

The controllable voltage generator 170 furthermore comprises a voltage generator circuit 172 embodied for example as a charge pump. It generates on the output side an internal supply voltage Vint2, which is fed to a controllable voltage generator 181. The controllable voltage generator 181 generates at an output terminal A181 a high level of the word line voltage VPP, which generally lies above the level of the external supply voltage. A level lying above a level of the external supply voltage ensures that a selection transistor AT of a memory cell SZ is reliably switched into the on state.

During operation of the integrated semiconductor memory device 100, the frequency detector 160 detects the frequency of the external clock signal CLK and generates a level of the control signal S1 in a manner dependent on the detected frequency. In a manner dependent on the level of the control signal S1, the voltage generator circuit 171 of the controllable voltage generator 170 generates a level of the internal supply voltage Vint1. A level of the voltages VBL, VBH and VB is derived from the level of the internal supply voltage Vint1 by the controllable voltage generators 182, 183 and 184. The charge pump 172 likewise generates a level of the internal supply voltage Vint2 in a manner dependent on the level of the control signal S1. The high level of the word line voltage VPP is generated by the controllable voltage generator 181 in a manner dependent on the level of the internal supply voltage Vint2.

In this case, the circuit arrangement is designed in such a way that upon detection of a high frequency of the external clock signal CLK, the level of the control signal S1 is altered by the frequency detector circuit 160 in such a way that the voltage generator 171 generates a high voltage level of the internal supply voltage Vint1, which, however, still lies below the level of the external supply voltage, and the charge pump 172 generates a high voltage level of the internal supply voltage Vint2, which lies above the level of the external supply voltage. Consequently, high levels of the voltages VPP, VBL, VBH and VB are also generated by the voltage generators 181, 182, 183 and 184 in the case when the integrated semiconductor memory device is driven with a high frequency of the external clock signal, lying for example in a region of 800 MHz. High levels of the supply voltage VB for supplying circuit components of the integrated semiconductor memory device and high levels of the bit line voltage VBH lie for example within a range of between 1.5 V and 1.7 V. The generation of high internal voltage levels enables the access speed to be increased and thus to be adapted to the increased clock frequency.

If, by contrast, the integrated semiconductor memory device is driven by a low frequency of the external clock signal CLK, for example a frequency of 100 MHz, then the frequency detector 160 generates a corresponding state of the control signal S1, whereby the voltage generator circuit 171 generates a level of the internal supply voltage Vint1 which is lower in comparison with the high level of the internal supply voltage Vint1 that is generated when the integrated semiconductor memory device is driven by the high clock frequency of the clock signal CLK, and, respectively, whereby the charge pump 172 generates a level of the internal supply voltage Vint2 which is lower in comparison with the high level of the internal supply voltage Vint2. As a result, the voltage levels—generated by the controllable voltage generators 181, 182, 183 and 184—of the voltages VPP, VBL, VBH and VB that are derived from the internal supply voltages Vint1 and Vint2 are also reduced.

The circuit concept proposed enables the integrated voltage generation to be dynamically adapted to the frequency of the applied clock signal. As a result of a lowering of the internal voltages when the integrated semiconductor memory device is driven with a low frequency of the clock signal CLK, the power loss can be reduced. Moreover, it is possible to reduce a voltage-/field-strength-driven contribution of leakage currents with a lowering of the internal voltages.

Figure 3:
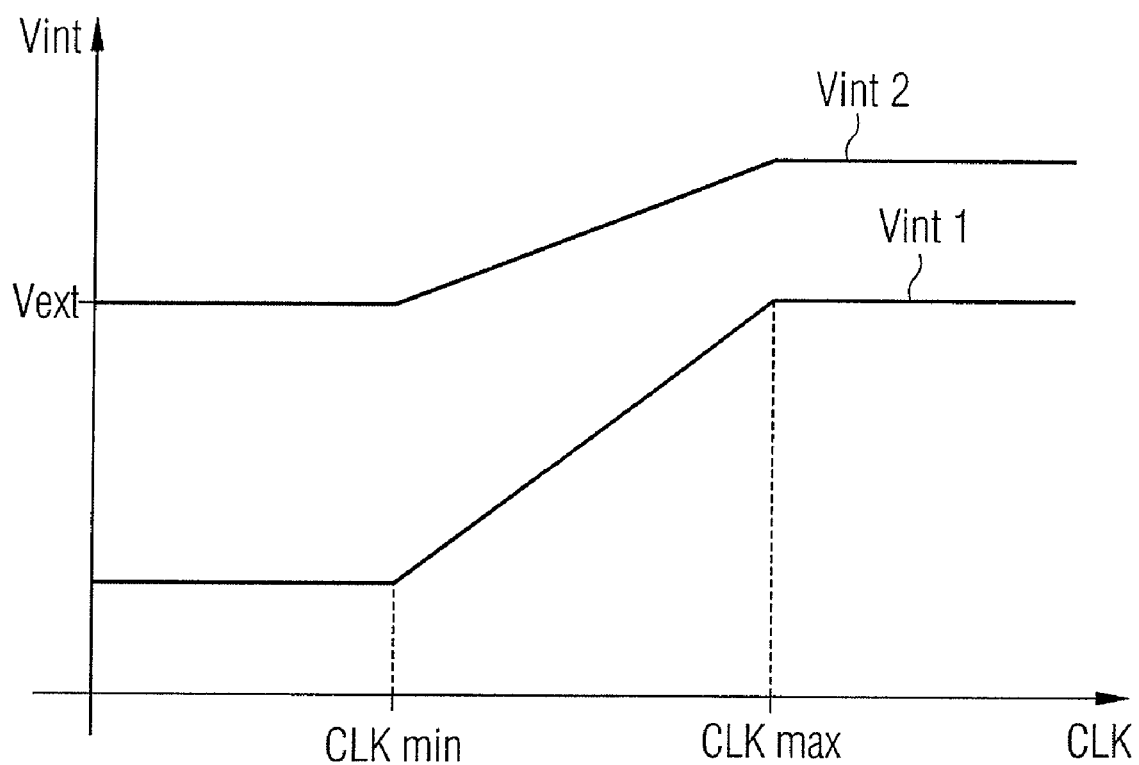
FIG. 3 shows a plot of the dependence of the internal supply voltage on an externally applied clock frequency.

FIG. 3 shows a dependence of the internal supply voltage Vint1 generated by the voltage generator circuit 171 and a dependence of the internal supply voltage Vint2 generated by the charge pump 172 on the frequency of the external clock signal CLK. When the integrated semiconductor memory device is operated with a low clock frequency lying below a specified frequency value CLKmin of 150 MHz, for example, the voltage generator circuit 171 generates a constant low level of the internal supply voltage Vint1. When the clock frequency rises above the specified frequency value CLKmin up to a specified frequency value CLKmax, lying at a frequency of 700 MHz, for example, the internal supply voltage Vint1 generated by the voltage generator circuit 171 increases continuously until it reaches almost the level of the external supply voltage Vext. Above the specified frequency value CLKmax, the voltage generator circuit 171 generates a constantly high level of the internal supply voltage Vint1.

The level of the internal supply voltage Vint2 that is generated by the charge pump 172 is in the region of the external supply voltage Vext at a clock frequency up to the specified frequency value CLKmin. If the applied clock frequency lies between the specified frequency values CLKmin and CLKmax, the level of the internal supply voltage Vint2 that is generated by the charge pump 172 also increases until, starting from when the specified clock frequency CLKmax is exceeded, the level is kept constant at a high level lying above the level of the external supply voltage Vext.

In the generation of the internal supply voltages Vint1 and Vint2 it is not absolutely necessary for the dependence of the internal supply voltages Vint1, Vint2 on the external frequency to have the linear profile illustrated between the frequencies CLKmin and CLKmax. However, the levels of the internal supply voltages should likewise increase as the frequency of the external clock signal increases.

Figure 4:
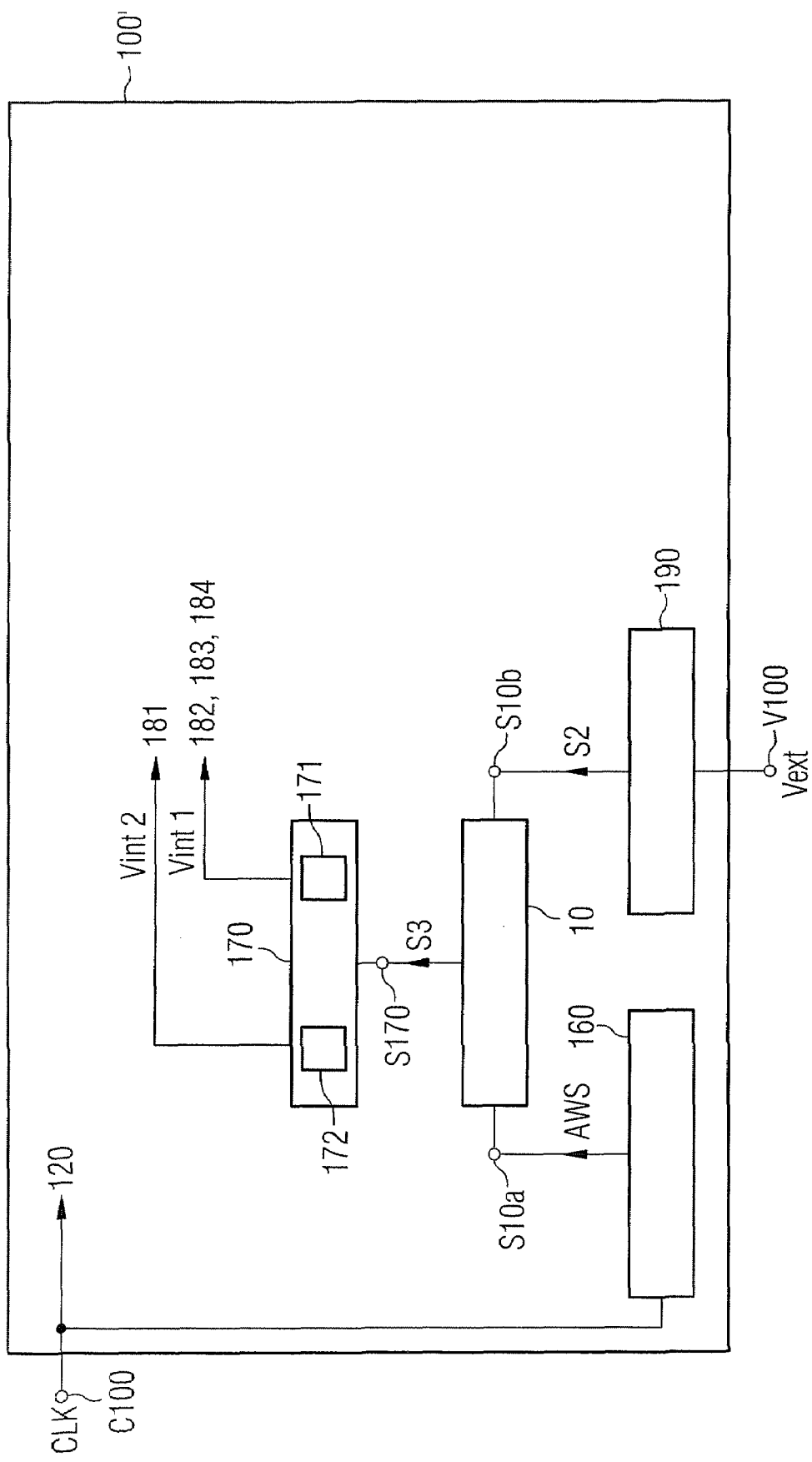
FIG. 4 shows a third embodiment of an integrated semiconductor memory device with generation of internal voltages.

FIG. 4 shows a further embodiment of an integrated semiconductor memory device 100'. The memory cell array 110, the control circuit 120, the address register 130 and also the column and row decoders 140 and 150 are not illustrated for reasons of simplification. The semiconductor memory 100' according to the invention has the frequency detector 160, to which the clock signal CLK is fed from the clock terminal C100. It furthermore has a voltage detector 190, which is connected to a supply voltage terminal V100' for application of the external supply voltage Vext.

In a manner dependent on the frequency of the external clock signal CLK, the frequency detector 160 generates on the output side a level of the control signal S1, which is fed to a control terminal S10a of an evaluation unit 10. The voltage detector 190 detects a level of the external supply voltage Vext and generates, in a manner dependent on the detected level of the external supply voltage, a level of the control signal S2, which is fed to a control terminal S10b of the evaluation circuit 10. The evaluation circuit 10 generates on the output side a control signal S3, which is fed to the control terminal S170 of the controllable voltage generator 170. The controllable voltage generator 170 comprises the voltage generator circuit 171 for generating the internal supply voltage Vint1 and the voltage generator circuit 172, which, in a manner similar to the embodiment of FIG. 2, is embodied as a charge pump for generating the internal supply voltage Vint2.

The voltage generator circuit 171 generates the internal supply voltage Vint1 with a level lying below the level of the external supply voltage. The charge pump 172 generates a level of the internal supply voltage Vint2 lying above the level of the external supply voltage.

In contrast to the embodiment illustrated in FIG. 2, in the case of the embodiment illustrated in FIG. 4, besides the frequency of the clock signal CLK additionally the level of the external supply voltage Vext is taken into account for the generation of the internal supply voltage Vint1 and Vint2. The evaluation circuit 10 is embodied in such a way that, in the case of a low frequency of the external clock signal CLK indicated to it by a corresponding state of the control signal S1 from the frequency detector 160, the evaluation circuit generates the control signal S3 in such a way that the controllable voltage generator 170 generates the internal supply voltages Vint1 and Vint2 with a low level.

When the frequency value of the external clock signal CLK rises, the control signal S3 is generated by the evaluation circuit 10 in such a way that the level of the internal supply voltage Vint1 and Vint2 is generated by the controllable voltage generator 170 with a greater level than is generated when the integrated semiconductor memory device is driven with the low level of the clock signal CLK.

In addition to the control signal S1, the evaluation circuit also evaluates the state of the control signal S2, which indicates the level of the external supply voltage Vext present. In a manner dependent on this additional information, the state of the control signal S3 that is set in a manner dependent on the control signal S1 is then altered in such a way that the level of the internal supply voltage generated by the controllable voltage generator 170 is trimmed slightly downward or upward.

The integrated semiconductor memory devices described above enable a dynamic adaptation of the on-chip voltages to the external clock frequency or a dynamic adaptation of the on-chip voltages to the external clock frequency while additionally taking account of the external supply voltage. As a result, it is possible to significantly reduce the power loss, for example during the operation of the integrated semiconductor memory device in the standby mode, in which the integrated semiconductor memory device is driven by a low clock frequency or a low supply voltage, by comparison with an integrated semiconductor memory device with a static generation of internal voltages. What is more, a logistical separation of semiconductor memories into semiconductor memories which are operated with high internal voltages for graphics applications, for example, and into those semiconductor memory devices which are used for example in control computers without complex graphics functions, within the manufacturing process, is no longer required.

While specific embodiments have been described in detail above, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SIGNS

10 Evaluation circuit
100 Integrated semiconductor memory device
110 Memory cell array
120 Control circuit
130 Address register
140 Column decoder
150 Row decoder
160 Frequency detector
170 Controllable voltage generator
171 Voltage generator circuit
172 Charge pump
181, 182, 183, 184 Controllable voltage generators
200 Integrated semiconductor memory device
210 Memory cell array
220 Control circuit
230 Address register
240 Column decoder
250 Row decoder
260 Memory circuit
270 Controllable voltage generator
281, 282, 283, 284 Controllable voltage generators
290 Evaluation unit
AT Selection transistor
BL Bit line
CLK Clock signal
S Control signal
SC Storage capacitor
SZ Memory cell
VB Supply voltage for internal circuit components
VBH Bit line high voltage
VBL Bit line low voltage
Vext External supply voltage
Vint Internal supply voltage
VPP Word line high voltage
WL Word line

What is claimed is:

1. An integrated semiconductor memory device comprising:
   a clock terminal to apply a clock signal;
   a first controllable voltage generator to generate an internal operating voltage that is fed as a supply voltage or a control voltage to a circuit component of the integrated semiconductor memory device so as to achieve read and write accesses; and
   a frequency detector to detect a frequency of the clock signal, the frequency detector being connected to the clock terminal;
   wherein the first controllable voltage generator is adapted to generate a level of the internal operating voltage in a manner dependent on the frequency of the clock signal as detected by the frequency detector.

2. The integrated semiconductor memory device of claim 1, wherein:
   the frequency detector is adapted to generate a first control signal in a manner dependent on the frequency of the clock signal; and
   the first controllable voltage generator is adapted to generate the level of the internal operating voltage in a manner dependent on the first control signal.

3. The integrated semiconductor memory device of claim 1, wherein the first controllable voltage generator is adapted to generate a first level of the internal operating voltage when the frequency detector circuit detects a first frequency of the clock signal, and the first controllable voltage generator generates a second level of the internal operating voltage when the frequency detector circuit detects a second frequency of the clock signal, the second frequency of the clock signal being greater than the first frequency of the clock signal and the second level of the internal operating voltage being greater than the first level of the internal operating voltage.

4. The integrated semiconductor memory device of claim 2, further comprising:
a supply voltage terminal to apply an external supply voltage; and
a second controllable voltage generator to generate an internal supply voltage, the second controllable voltage generator comprising a control terminal to drive with a control signal and that is connected to the supply voltage terminal;
wherein:
the control terminal of the second controllable voltage generator is connected to the frequency detector so as to drive with the first control signal;
the second controllable voltage generator is adapted to generate from the external supply voltage a level of the internal supply voltage in a manner dependent on the first control signal;
the second controllable voltage generator is connected to the first controllable voltage generator to drive the first controllable voltage generator with the internal supply voltage; and
the first controllable voltage generator is adapted to generate the level of the internal operating voltage in a manner dependent on the level of the internal supply voltage.

5. The integrated semiconductor memory device of claim 1, further comprising:
a voltage detector to detect a level of the external supply voltage, the voltage detector being connected to the supply voltage terminal;
wherein the first controllable voltage generator is adapted to generate a level of the internal operating voltage in a manner dependent on the level of the external supply voltage detected by the voltage detector.

6. The integrated semiconductor memory device of claim 5, wherein:
the voltage detector is adapted to generate a second control signal in a manner dependent on the level of the external supply voltage; and
the first controllable voltage generator is adapted to generate the level of the internal operating voltage in a manner dependent on the second control signal.

7. The integrated semiconductor memory device of claim 5, wherein the first controllable voltage generator is adapted to generate a first level of the internal operating voltage when the voltage detector circuit detects a first level of the external supply voltage, and the first controllable voltage generator is further adapted to generate a second level of the internal operating voltage when the voltage detector circuit detects a second level of the external supply voltage, the second level of the external supply voltage being greater than the first level of the external supply voltage and the second level of the internal operating voltage being greater than the first level of the internal operating voltage.

8. The integrated semiconductor memory device of claim 6, further comprising an evaluation circuit to evaluate the first control signal and the second control signal and to generate a third control signal, wherein:

the evaluation circuit is adapted to generate a state of the third control signal in a manner dependent on respective states of the first and second control signals;
the control terminal of the second controllable voltage generator is connected to the evaluation circuit so as to drive with the third control signal; and
the second controllable voltage generator is adapted to generate the level of the internal supply voltage in a manner dependent on the third control signal.

9. The integrated semiconductor memory device of claim 4, wherein:
the second controllable voltage generator includes a first voltage generator circuit to generate a first internal supply voltage; and
the first voltage generator circuit is adapted to generate the first internal supply voltage with a level that is less than the level of the external supply voltage.

10. The integrated semiconductor memory device of claim 9, wherein:
the second controllable voltage generator includes a second voltage generator circuit to generate a second internal supply voltage; and
the second voltage generator circuit is adapted to generate the second internal supply voltage with a level that is greater than the level of the external supply voltage.

11. The integrated semiconductor memory device of claim 10, wherein the second voltage generator circuit comprises a charge pump.

12. The integrated semiconductor memory device of claim 1, further comprising:
a memory cell array comprising memory cells, each memory cell being arranged at a crossover point of a row line and a column line;
a column decoder to access a selected column line; and
a row decoder to access a selected row line;
wherein each of the column and row decoders is fed the internal operating voltage as a supply voltage that selects a column line and a row line for carrying out the read and write accesses.

13. The integrated semiconductor memory device of claim 12, wherein:
each memory cell comprises a selection transistor to select the memory cell for read and write access; and
the internal operating voltage is fed to a selected transistor as a control voltage that selects the memory cell corresponding with the selected transistor for read and write accesses.

14. A method for operating an integrated semiconductor memory device, comprising:
providing an integrated semiconductor memory device comprising a frequency detector that detects a frequency of a clock signal to be applied to a clock terminal of the integrated semiconductor memory device, and a controllable voltage generator that generates an internal operating voltage to be fed as a supply voltage or a control voltage to a circuit component of the integrated semiconductor memory device for carrying out read and write accesses;
applying the clock signal to the clock terminal of the integrated semiconductor memory device;
detecting the frequency of a clock signal with the frequency detector;
generating a level of the internal operating voltage in a manner dependent on the frequency of the clock signal detected by the frequency detector; and driving the circuit component of the integrated semiconductor memory device with the internal operating voltage so as to achieve read and write accesses.

15. The method of claim 14, wherein the controllable voltage generator generates a first level of the internal operating voltage when the frequency detector detects a first frequency of the clock signal, and the controllable voltage generator generates a second level of the internal operating voltage when the frequency detector detects a second frequency of the clock signal, the second frequency of the clock signal being greater than the first frequency of the clock signal and the second level of the internal operating voltage being greater than the first level of the internal operating voltage.

16. The method of claim 14, wherein:

the integrated semiconductor memory device further comprises a voltage detector that detects a level of an external supply voltage that is fed to a supply voltage terminal of the integrated semiconductor memory device;

wherein the level of the internal operating voltage is generated in a manner dependent on the frequency of the clock signal detected by the frequency detector and in a manner dependent on the level of the external supply voltage detected by the voltage detector.

* * * * *